United States Patent
Wipenmyr

[11] Patent Number: 5,869,834
[45] Date of Patent: Feb. 9, 1999

[54] PHOTODETECTOR HAVING AN INTEGRATED FUNCTION FOR ELIMINATION OF THE EFFECTS OF STRAY LIGHT

[75] Inventor: Jan Erik Wipenmyr, Göteborg, Sweden

[73] Assignee: Sitek Electro Optics AB, Partille, Sweden

[21] Appl. No.: 809,536
[22] PCT Filed: Sep. 11, 1995
[86] PCT No.: PCT/SE95/01021
 § 371 Date: Mar. 14, 1997
 § 102(e) Date: Mar. 14, 1997
[87] PCT Pub. No.: WO96/08702
 PCT Pub. Date: Mar. 21, 1996

[30] Foreign Application Priority Data

Sep. 16, 1994 [SE] Sweden .................... 9403098

[51] Int. Cl.⁶ ...................................... H01J 40/14
[52] U.S. Cl. ........................ 250/214.1; 257/461
[58] Field of Search .................. 250/214.1, 214 R, 250/239, 208.1; 257/435, 440, 448, 457, 461, 80–84

[56] References Cited

FOREIGN PATENT DOCUMENTS

| 0243170 | 10/1987 | European Pat. Off. . |
| 0298458 | 1/1989 | European Pat. Off. . |
| 0545905 | 6/1993 | European Pat. Off. . |

*Primary Examiner*—Que T. Le
*Attorney, Agent, or Firm*—Dvorak & Orum

[57] ABSTRACT

A photodetector for measuring the position of an incident light beam on an active surface area of the detector includes an inactive area and a concentric stray light absorbing area, both of which outwardly surround the light-absorbing active area. All light incident on the stray light-absorbing area and the inactive area will generate a photoelectric current which is conducted to an earth ground via an electrode in the stray-light area. An electrical signal from the active area representing a position of the measured light in the active area will be unaffected by any stray light incident on the detector externally of the active area.

1 Claim, 1 Drawing Sheet

PHOTODETECTOR HAVING AN INTEGRATED FUNCTION FOR ELIMINATION OF THE EFFECTS OF STRAY LIGHT

BACKGROUND OF THE INVENTION

1. Field of the Invention

The subject invention concerns a device for measuring the position of a lighting spot having an integrated function, in order to handle stray light.

2. Discussion of the Prior Art

A position-sensitive photodetector, PSD, consists of a semiconductor wafer having a doped active surface with electrodes positioned in mutually opposite sides. The doped active area forms a pn-junction in the semiconductor wafer, and a resistive layer. An incident light beam will generate a photoelectric current which is proportional to the intensity of the incident light. Also, the photoelectric current will be divided in the resistive layer in the two electrodes linearly with the distance from the respective electrode. By comparing the magnitudes of the currents the expression $(I_A - I_B)/(I_A + I_B)$ gives the position of the light beam on the active surface of the detector. ($I_A$ and $I_B$ represent the currents from respectively electrodes A and B). This is true with a high degree of linearity when the lighting point is incident only on the active surface. On the other hand, if light is incident on the semiconductor wafer externally of the active surface (which normally is referred to as the inactive area) a photoelectric current is generated also in this area and is registered in both electrodes. However, these currents are non-linear as well as slow. In other words, the position signal becomes considerably more non-linear and also very much slower. Thus, the possibility of obtaining satisfactory position measurements is impaired and sometimes even made impossible. In cases when the detector is used in applications where stray light occurs, this a considerable problem.

When the stray light emanates from other light sources than the measuring light it is possible, provided that the stray light intensity is within reasonable boundaries, to handle the stray light by means of either electrical or optical filters. An electrical filter is effective by screening off, in the subsequent signal processing, signals emanating from light having a different modulation from that of the measuring light. This method is adopted above all when a modulated light source having a comparatively high degree of modulation is used, such as 10 kHz, and receiving low-modulated or non-modulated stray light from the environment, such as sun light or fluorescent light etc. Optical bandpass filters operate by only letting through light having wavelengths within a narrow wavelength range. This phenomenon is used when the stray light has a different wavelength from that of the measuring light but otherwise the same modulation (most often non-modulated).

When the stray light emanates from the measuring light itself, owing to reflections in the metal parts of the instrument, for instance, or has a wavelength and a modulation close to that of the measuring light, the problem becomes more difficult to solve. The only way to eliminate the effects of stray light has hitherto been to screen off the stray light from the detector in some way or other. This could be effected in two different ways. Either a diaphragm is placed immediately above the detector or by applying directly on the detector surface a means screening off the light from the inactive area; The diaghragm could either be in the shape of a thin metal foil which is placed immediately ahead of the detector, or a diaghragm which is integrated into the protective glass by means of thin-film technology. This method puts considerably demands on the mounting of the diaghragm, particularly in the case of small-size detectors. In addition, diffraction phenomena may occur in diaghragm opening which thus generates stray light. The other possibility, to apply, in the processing of the very detector, some material screening off the light from the inactive areas, may be effected through vapourization of a metal, gold or aluminium. The disadvantages are that the thickness required in order to obtain absolute screening off of the stray light is not compatible with a normal semiconductor process. In addition, the presence of metal on these surfaces generates problems concerning the electrical properties of the detector. The consequence frequently is high leak currents that and growth thereof may come adrift. An absorbing paint, alternatively an epoxy, may be applied directly on the inactive detector area. This does, however, entail some obvious disadvantages in as much as on the one hand it is difficult to achieve sufficient opacity in the paint/epoxy to prevent passage-through of stray light and on the other the work involved in applying the paint/epoxy is a pure manual task, possible to carry out only when small quantities are involved, in addition to which the task is difficult to perform with the desired accuracy.

SUMMARY OF THE INVENTION

The invention aims at eliminating the effects of a stray light on the inactive area by doping, around the active surface 1, a further area 2 which also forms a pn-junction. This area is connected to earth.

DETAILED DESCRIPTION OF THE DRAWINGS

Figure 1:
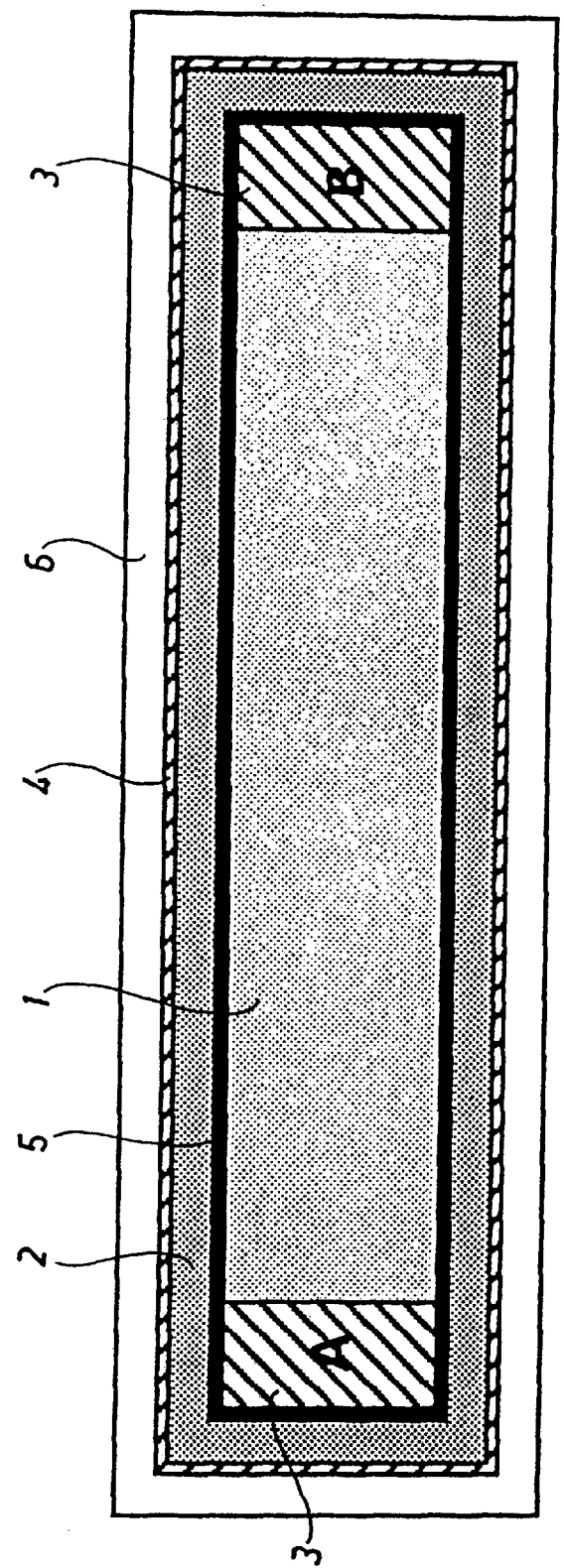

The FIGURE is schematic view of the photodetector of the present invention.

DETAILED DESCRIPTION OF THE PREFERRED EMBODIMENT

All photoelectric current that is generated as a result of light incident on the stray light receiving area 2 will be connected to earth and therefore will not affect the position signal from the active surface 1. Also the photoelectric current formed by the stray light incident on the inactive area 6 outside the stray light receiving area 2 will be handled by the latter area 2 and be conducted to earth via its electrode 4. The active area and the stray light receiving area must be separated by an inactive area 5. When the latter is made as narrow as possible, approximately 10 μm, which is a great deal narrower than is possible with anyone of the methods mentioned above, the signal from this area 5 will have but a minimum effect on the position signal.

The invention is not in any way limited to the geometry illustrated in the accompanying drawing figure but could be applied to optional geometries in 1-dimensional PSDs, 2-dimensional PSDs as well as in photodetectors of various appearences and geometries, such as dual, 4-quadrant, arrays and the like.

I claim:

1. A position-sensitive photodetector for measuring the position of an incident light beam having energy, comprising:

a semiconductor wafer having a doped active surface and a pair of ends;

a resistive layer on the active surface of the wafer;

two opposed electrodes on each end of said active surface;

a stray-light area arranged externally around the active surface, said stray-light area for measuring stray-light contacting said photodetector and for preventing said stray light from affecting a position measuring signal of said incident light beam, said stray light area comprising a doped area containing a pn-junction and a grounding electrode attached thereto, the signal from said stray light area being grounded;

a first inactive area externally surrounding said stray-light area and a second inactive area disposed between said active area and said stray-light area, each inactive area connected to said same ground as said stray-light area.

* * * * *